United States Patent [19]

Jones et al.

[11] Patent Number: 5,952,863
[45] Date of Patent: Sep. 14, 1999

[54] CIRCUIT AND METHOD FOR GENERATING NON-OVERLAPPING CLOCK SIGNALS FOR AN INTEGRATED CIRCUIT

[75] Inventors: Jason A.T. Jones, Houston; Gary L. Swoboda, Sugarland, both of Tex.

[73] Assignee: Texas Instruments Incorporated, Dallas, Tex.

[21] Appl. No.: 08/762,169

[22] Filed: Dec. 9, 1996

[51] Int. Cl.⁶ .............................. H03K 5/19; H03K 5/15
[52] U.S. Cl. ........................ 327/295; 327/259; 327/115
[58] Field of Search .................................. 327/291, 293, 327/295, 258, 259, 256, 257, 115, 114, 117

[56] References Cited

U.S. PATENT DOCUMENTS

| | | | |
|---|---|---|---|
| 3,641,370 | 2/1972 | Heimbigner | 307/269 |
| 3,660,767 | 5/1972 | Yoshino et al. | 328/15 |
| 3,863,161 | 1/1975 | Johnson et al. | 328/140 |
| 4,109,209 | 8/1978 | Bismarck | 328/60 |
| 4,420,696 | 12/1983 | Gemma et al. | 307/262 |
| 4,504,960 | 3/1985 | Yamada | 375/94 |
| 4,645,947 | 2/1987 | Prak | 307/269 |
| 4,658,217 | 4/1987 | Takatori et al. | 328/139 |
| 4,695,873 | 9/1987 | Smith | 358/13 |
| 4,816,700 | 3/1989 | Imel | 307/269 |
| 4,882,505 | 11/1989 | Furman | 327/291 |
| 5,005,193 | 4/1991 | Simpson | 327/291 |
| 5,148,050 | 9/1992 | Koide | 307/271 |
| 5,293,346 | 3/1994 | Nakajima et al. | 307/221 |
| 5,341,031 | 8/1994 | Kinoshita et al. | 307/269 |
| 5,357,204 | 10/1994 | Knoll | 327/291 |
| 5,424,668 | 6/1995 | Kohsaka | 327/175 |
| 5,444,405 | 8/1995 | Truong et al. | 327/239 |
| 5,532,633 | 7/1996 | Kawai | 327/174 |
| 5,625,311 | 4/1997 | Nakatsu | 327/293 |

FOREIGN PATENT DOCUMENTS

| | | | |
|---|---|---|---|
| 63086414 | 10/1989 | Japan | H03K 5/15 |
| 0656688 | 6/1995 | Japan | H03K 5/15 |

OTHER PUBLICATIONS

Turinsky, Gunter; *Schaltungen zur Veranderung der Impulsdauer, Radio Fernshehen Elektronik*, vol. 30, No. 5, 1981, Berlin, DDR, p. 328 XP002065293 (no translation).

*Primary Examiner*—Timothy P. Callahan
*Assistant Examiner*—Eunja Shin
*Attorney, Agent, or Firm*—Gerald E. Laws; Robert D. Marshall, Jr.; Richard L. Donaldson

[57] ABSTRACT

A method is provided for forming non-overlapping clock signals 402 and 404 for an integrated circuit. A reference clock 300 whose frequency is twice that of a desired operating frequency for the integrated circuit is used. A master clock signal is formed which has a high pulse width T9a which is approximately the same as the high pulse width of the reference clock, but the frequency of the master clock is one half the frequency of the reference clock. Likewise, a slave clock signal is formed which has a high pulse width T10a which is approximately the same as the high pulse width of the reference clock, but the frequency of the slave clock is also one half the frequency of the reference clock. The high pulse width of either or both the master clock signal and slave clock signal is then widened by an analog delay means, but by an amount T13 and T14 which is less than the low pulse width of the reference clock, so that the master clock signal and the slave clock signal do not overlap each other. As the propagation time of circuit elements within the integrated circuit varies due to changes in operating temperature or voltage, the analog delay T13 and T14 is changed proportionally to compensate for the changes in propagation time of the circuit elements.

20 Claims, 5 Drawing Sheets

ས5,952,863

CIRCUIT AND METHOD FOR GENERATING NON-OVERLAPPING CLOCK SIGNALS FOR AN INTEGRATED CIRCUIT

FIELD OF THE INVENTION

This invention relates to the field of driver circuits for generating non-overlapping clock output signals for electronic processing systems and devices.

BACKGROUND OF THE INVENTION

In an integrated circuit device, it is often desired to utilize a plurality of clocking signals for various portions of the circuit. In order to maximize efficiency, it is preferred to generate all clocking signals used on the integrated circuit from a single clock input. Many circuit designs today employ a two-phase clocking scheme for clocking latches and registers. Typically the two phases consist of a master and slave which must be non-overlapping in order to avoid data run-through or other timing hazards. However, this non-overlap timing can be difficult to maintain across various processes, temperatures, voltages, and loading.

In a typical circuit for generating non-overlap clock signals shown in prior art FIG. 1, a single reference clock 100 is used to derive two non-overlapping clocks, a master 102 and a slave 104.

The non-overlap timing is usually implemented by having an analog delay path connected to reference clock 100 to delay each rising edge of master clock 102 by a delay time T1 and by having an analog delay path connected to reference clock 100 to delay each rising edge of slave clock 104 by a delay time T2.

A disadvantage of the prior art scheme is that the analog delays are very dependent on process parameters, operating temperature, and operating voltage. Thus, for parts which are produced with operating characteristics which fall in a weak corner of a process schmoo plot of frequency vs. voltage or temperature, the analog delay will increase as indicated by additional delay time T3 in prior art FIG. 2, resulting in a shorter HIGH pulse width T4 on clock signals 102 and/or 104. This can cause problems since the device in general will operate slower at weak corners and generally will require longer pulse widths to accommodate the longer delays through the various layers of logic circuitry.

Another disadvantage of this scheme is that the analog delay is very difficult to control across all process/temperature/voltage corners. So if a minimum amount of non-overlap time is required for the device to function properly, the circuit must be designed to provide enough delay to ensure this non-overlap time, even at a strong corner of the process schmoo. Then at the weak corner, the non-overlap time can become excessively large and impact the maximum operating frequency of the device, as mentioned above.

Therefore, it is an object of the present invention to provide a driver circuit which results in the output of non-overlapping clocking signals.

It is further an object of the present invention to provide a driver circuit which is process insensitive.

Other objects and advantages will be apparent to those of ordinary skill in the art having reference to the following figures and specification.

SUMMARY OF THE INVENTION

In accordance with the present invention, a method is provided for forming non-overlapping clock signals for an integrated circuit. A reference clock whose frequency is twice that of a desired operating frequency for the integrated circuit is used. The reference clock has a high pulse width and a low pulse width within each period. A master clock signal is formed which has a high pulse width which is approximately the same as the high pulse width of the reference clock, but the frequency of the master clock is one half the frequency of the reference clock. Likewise, a slave clock signal is formed which has a high pulse width which is approximately the same as the high pulse width of the reference clock, but the frequency of the slave clock is also one half the frequency of the reference clock. The high pulse width of either or both the master clock signal and slave clock signal is then widened by an analog delay means, but by an amount which is less than the low pulse width of the reference clock, so that the master clock signal and the slave clock signal do not overlap each other.

As the propagation time of circuit elements within the integrated circuit varies due to changes in operating temperature or voltage, the analog delay is changed proportionally to compensate for the changes in propagation time of the circuit elements.

BRIEF DESCRIPTION OF THE DRAWINGS

Other features and advantages of the present invention will become apparent by reference to the following detailed description when considered in conjunction with the accompanying drawings, in which.

Corresponding numerals and symbols in the different figures and tables refer to corresponding parts unless otherwise indicated.

DETAILED DESCRIPTION OF EMBODIMENTS OF THE INVENTION

It has now been discovered that problems which were discussed in reference to prior art non-overlap clock generators can be handled with innovative techniques of the present invention which uses a digital circuit to form non-overlapping clock signals and then uses supplemental analog delays to lengthen pulse widths of the clock signals.

Figure 1:
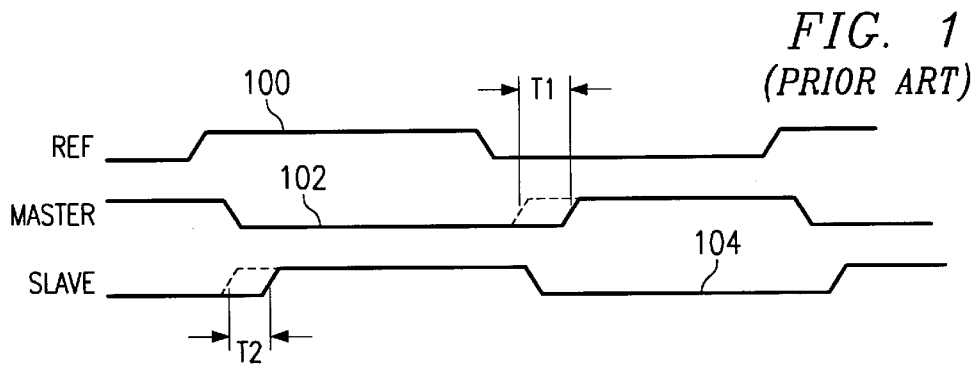
FIG. 1 is a timing diagram of prior art non-overlapping clock signals produced with analog delay.
Figure 2:
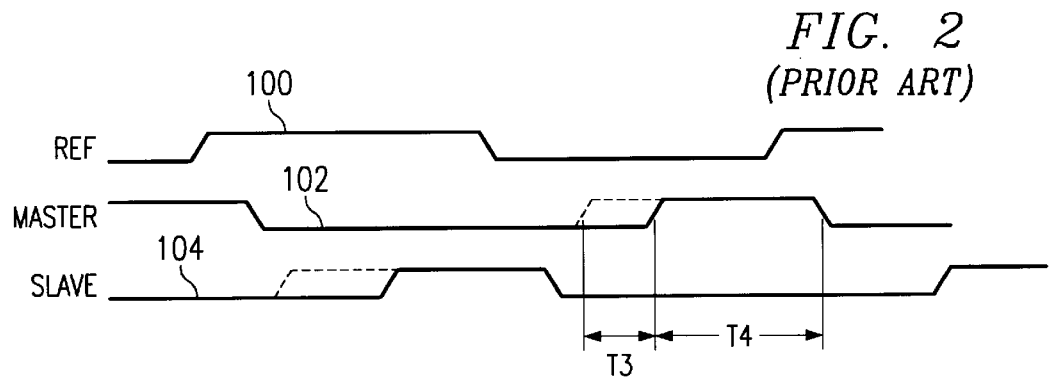
FIG. 2 is a timing diagram of prior art non-overlapping clock signals showing timing degradation.
Figure 3:
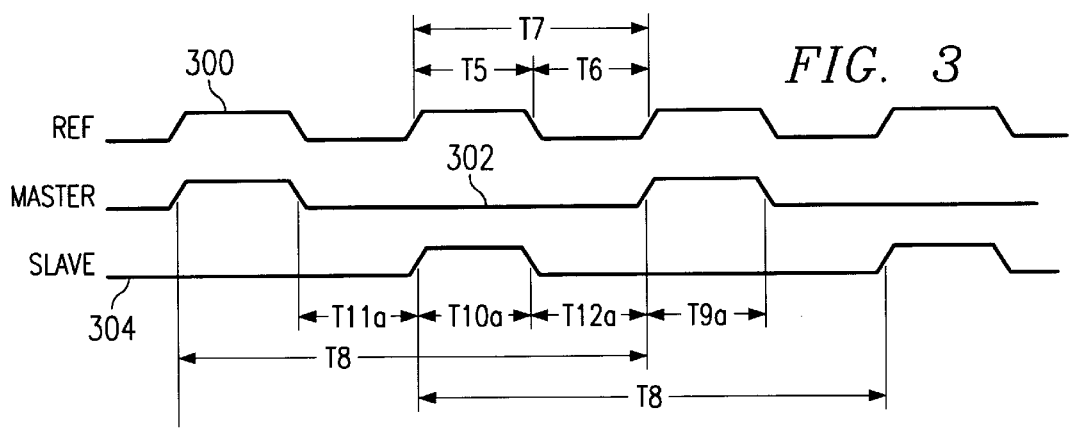
FIG. 3 is a timing diagram of non-overlapping clock signals produced by digital means according to the present invention.

FIG. 3 is a timing diagram of non-overlapping clock signals produced by digital means according to the present invention. This scheme requires the reference clock 302 to be twice as fast as the desired output clock frequency. The actual non-overlap timing is performed digitally while the clock pulse width is improved with analog delays.

Non-overlapping clock signals are created digitally by using every other high pulse of reference clock 300 to form master clock 302 and slave clock 304. Reference clock 300 has a period of time T7 which includes a high pulse width T5 and a low pulse width of T6. Master clock 302 is formed with a period time of T8, which is twice as long as period T7. Master clock 302 has a high pulse width T9a which is approximately equal to high pulse width T5 of reference clock 300. Likewise, slave clock 304 is formed with a period time of T8, which is twice as long as period T7 and has a high pulse width T10a which is approximately equal to high pulse width T5. Thus, there is always a non-overlap time T11a and T12a between each high pulse of clock 302 and 304 that is equal to approximately low pulse width T6 of reference clock 300.

Figure 4:
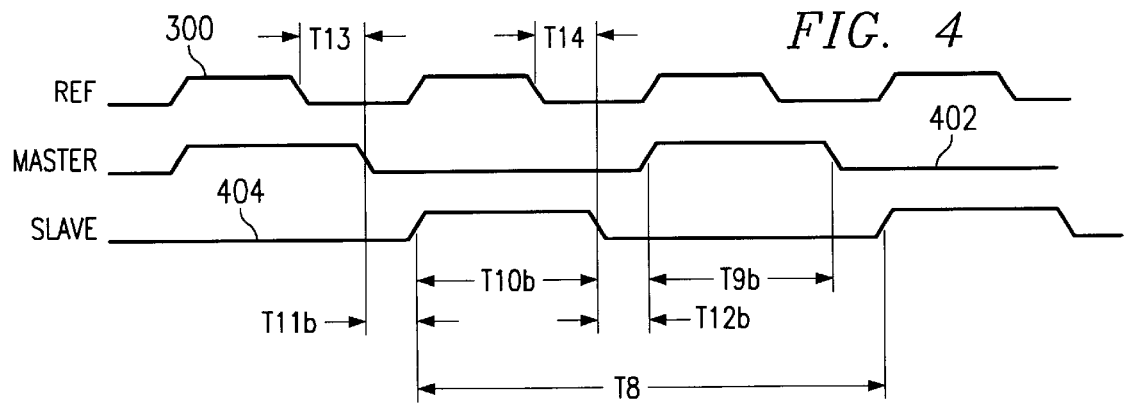
FIG. 4 is a timing diagram of the non-overlapping clock signals of FIG. 3 enhanced with an analog delay of trailing edges, according to the present invention.

A drawback of this fully digital scheme is that the master/slave high pulse widths T9a and T10a may not be wide enough for certain logic circuit designs within an integrated circuit (IC). This is handled by introducing some analog delay on the falling edge of each master clock signal edge, as shown in FIG. 4, as delay time T13 and on the falling edge of each slave clock signal edge as delay time T14.

Advantageously, unlike the prior art non-overlap circuit, process dependence of the analog delay is not a problem when used to widen pulse width T9a and T10a as described herein. Various process parameters such as doping, oxide thickness, resitivity, etc can cause variations in the propagation deley of circuit elements on an integrated circuit. For an IC which is produced in a slow corner of a production process schmoo plot, analog delay will increase, thereby increasing pulse width T9b and T10b and thereby giving slow timing paths in a logic circuit design more time to propagate. For an IC in a fast corner, pulse width T9b and T10b will decrease, but the timing paths within the IC will also speed up and need less propagation time.

Another advantage of the analog delay technique of the present invention is analog delays T13 and T14 only need to be optimized at the weak corner of the process plot to ensure the desired minimum non-overlap time T11b and T12b.

Figure 5:
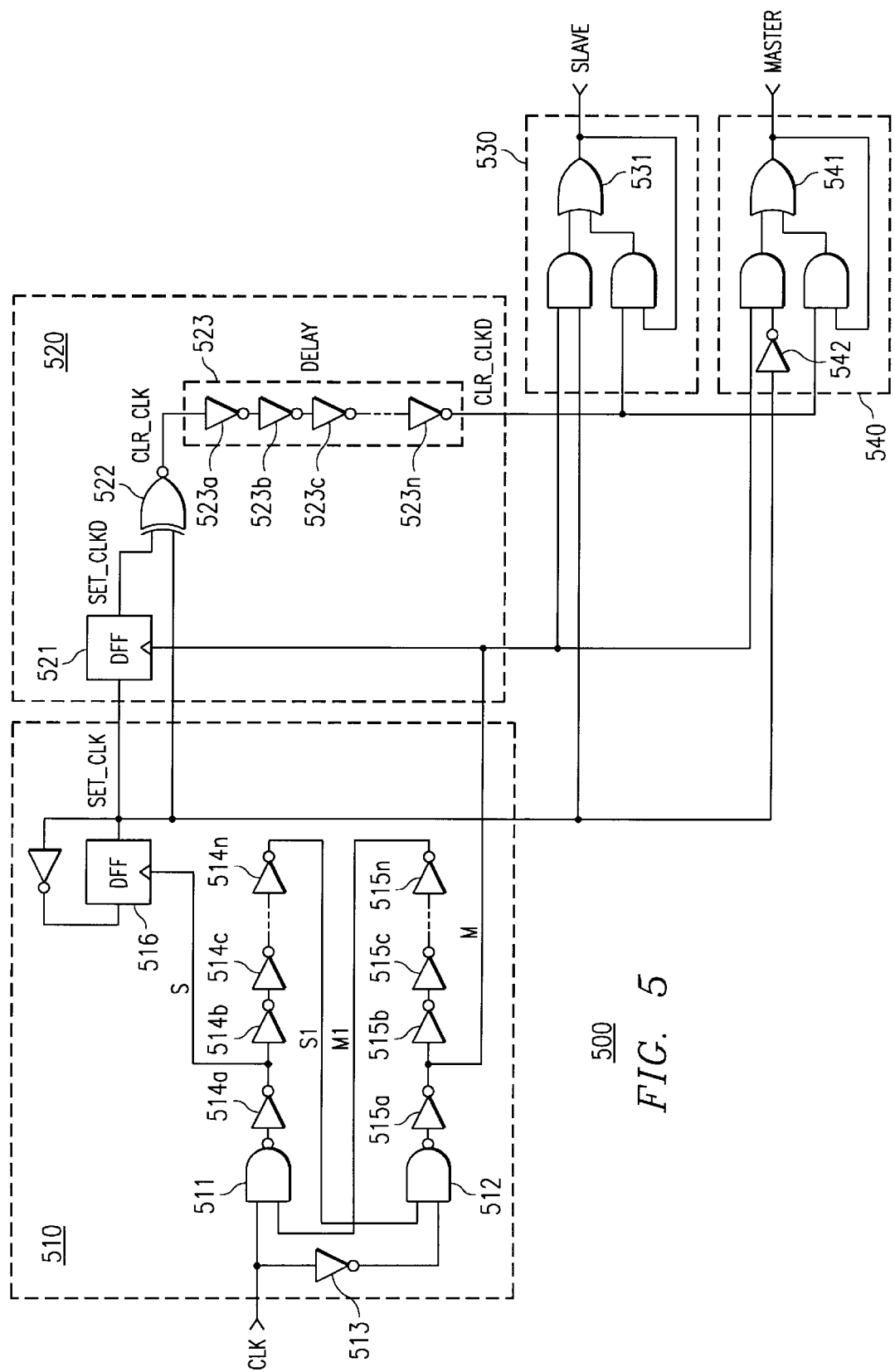
FIG. 5 is a schematic diagram of a clock circuit for forming non-overlapping clock signals according to the present invention.
Figure 6:
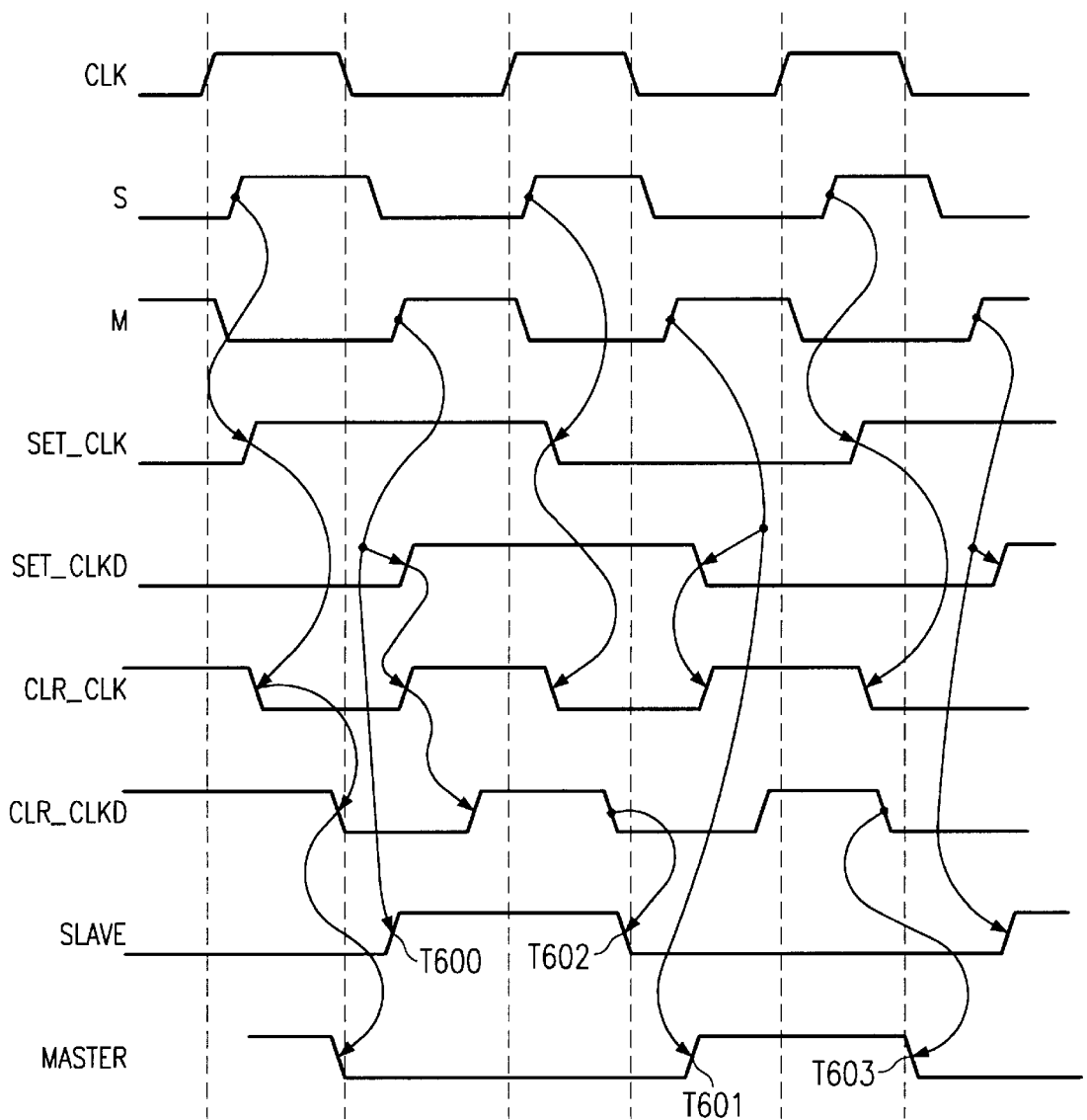
FIG. 6 is a timing diagram of the clock circuit of FIG. 5.

FIG. 5 is a schematic diagram of a clock circuit 500 for forming non-overlapping clock signals according to the present invention, while FIG. 6 is a timing diagram illustrating the operation of this circuit. A single reference clock signal CLK is provided to clock circuit 500. Two outputs of circuit 500 provide a two-phase non-overlapping clock which consists of clock signal MASTER and clock signal SLAVE running at one half the frequency of reference clock signal CLK.

Reference signal CLK is received by receiving circuitry 510. Gates 511–513, 514a–n and 515a–n form two preliminary non-overlapping clock signals S and M using a typical circuit which delays the rising edge of signals S and M, as shown in FIG. 6. These preliminary non-overlapping clock signals are needed to ensure that no glitches occur during the formation of clock signals MASTER and SLAVE. Note that the preliminary non-overlap circuitry is the traditional type which delays leading edges. This is acceptable in this case since the local S/M clocks go to minimal logic and can be well controlled.

Local clock signal S clocks a D flip-flop 516 to produce a signal SET_CLK Signal SET_CLK is simply signal S divided by two and is used by slave circuitry 530 to form clock signal SLAVE and by master circuitry 540 to form clock signal MASTER.

Slave circuitry 530 has an asynchronous latch formed by and-or gate 531 which produces signal SLAVE. Signal SET_CLK gates signal M to set this latch to form a rising edge of clock signal SLAVE, as shown in FIG. 6 at time T600.

Similarly, inverted SET_CLK gates signal M to set another asynchronous latch 541 in master circuitry 540 which produces a rising edge of clock signal MASTER at time T601. Note that signal M is asserted only when SET_CLK is stable, thus ensuring that there will be no glitches that could accidentally set asynchronous latch 541. This is the reason why local non-overlapping clocks M and S were generated.

Signal M clocks a flip-flop 521 in delay circuitry 520 to produce a signal SET_CLKD, which is a delayed version of signal SET_CLK. SET_CLK and SET_CLKD are XNORed with gate 522 to produce a signal CLR_GLK. CLR_CLK is then delayed by delay block 523 to produce signal CLR_CLKD. When CLR_CLKD goes LOW, asynchronous latches 531 and 541 for SLAVE and MASTER are cleared at times T602 and T603, respectively. The delay time of delay block 523 which produces CLR_CLKD can be "fine-tuned" to achieve the desired minimum non-overlap time and minimum pulse width by varying the number of inverters 523a–n, for example. Note that the same fall time delay will apply to both MASTER and SLAVE. This is why signal SET_CLKD and XNOR gate 522 were used.

Figure 7:
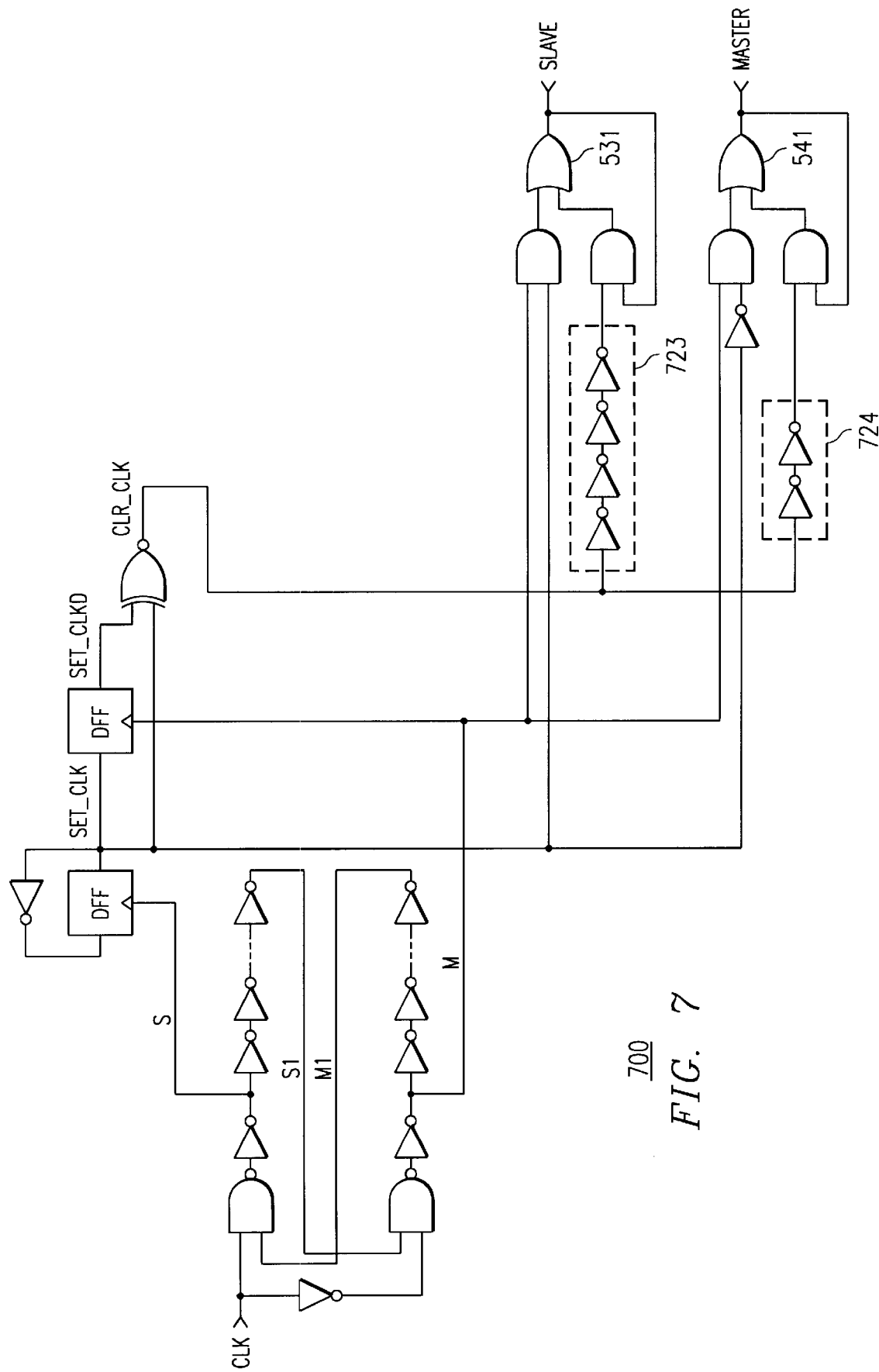
FIGS. 7, 7A and 7B are a schematic diagram of an alternate embodiment of a clock circuit for forming non-overlapping clock signals according to the present invention.

FIG. 7 is a schematic diagram of an alternate embodiment of a clock circuit 700 for forming non-overlapping clock signals according to the present invention. Clock circuit 700 is similar to clock circuit 500, except that two delay blocks 723 and 724 are used to clear asynchronous latches 531 and 541 for SLAVE and MASTER. Delay blocks 723 and 724 may be fine-tuned to have a different delays so that clock signals SLAVE and MASTER have different pulse widths.

Figure 7A:
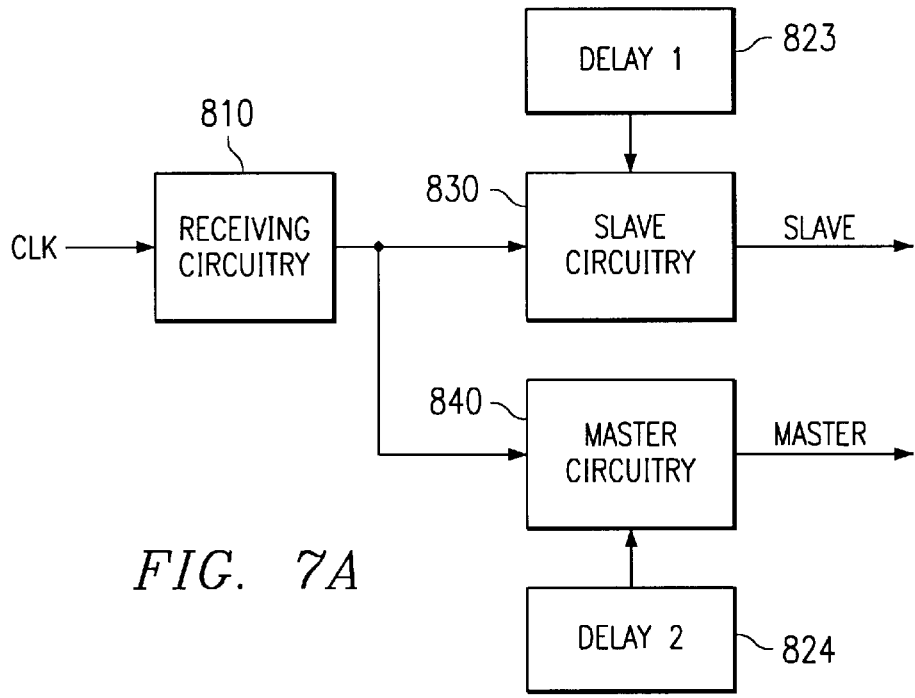

An alternative embodiment of a clock circuit for forming non-overlapping clock signals for an integrated circuit will now be described with reference to FIG. 7A. Receiving circuitry 810 is provided within the integrated circuit for receiving a reference clock CLK whose frequency is twice that of a desired operating frequency for the integrated circuit. The reference clock has a first period consisting of a first pulse which has a first pulse width T5 (see FIG. 3) and a second pulse having a second pulse width T6. Master circuitry 840 is connected to the receiving circuitry for forming a master clock MASTER which has a second period which is twice as long as the first period, consisting of a third pulse having a third pulse width T9a which is approximately equal to the first pulse width and fourth pulse having a fourth pulse width. Slave circuitry 830 is connected to the receiving circuitry for forming a slave clock SLAVE having a third period which is twice as long as the first period, consisting of a fifth pulse T10a having a fifth pulse width which is approximately equal to the first pulse width and sixth pulse having a sixth pulse width, the fifth pulse being separated in time from the third pulse by approximately the second pulse width so that the master clock and the slave clock do not overlap. A first delay circuitry 823 is connected to the master circuitry for lengthening the third pulse width by a first amount T13 (see FIG. 4) which is less than the second pulse width. A second delay circuitry 824 is connected to the slave circuitry for lengthening the fifth pulse width by an amount T14 which is less than the second pulse width. Alternatively, the first delay circuitry may be connected to the slave circuitry for lengthening the fifth pulse width by an amount which is less than the second pulse width.

First delay circuitry 923 is responsive to a change in operating temperature or operating voltage of the integrated circuit to change the third pulse width by a second amount which is proportional to a change in signal propagation time of a logic element within the integrated circuit in response to the change in operating temperature, operating voltage, or processing parameters of the integrated circuit.

Figure 7B:
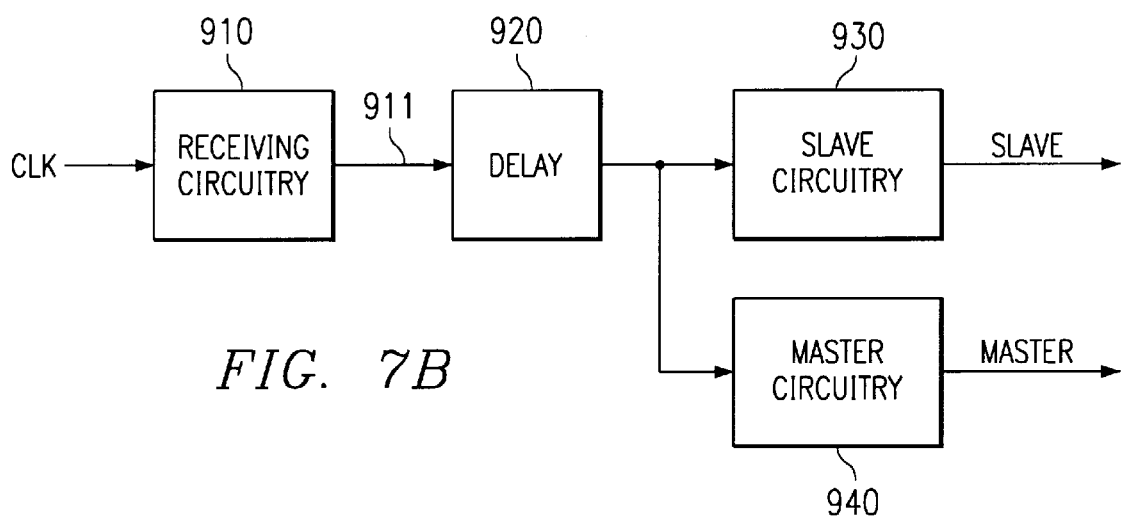

In another embodiment, a clock circuit for forming non-overlapping clock signals for an integrated circuit is provided as follows, with reference to FIG. 7B. Receiving circuitry 910 is provided within the integrated circuit for receiving a reference clock CLK whose frequency is twice that of a desired operating frequency for the integrated circuit, the reference clock having a first period consisting of a first pulse having a first pulse width and a second pulse having a second pulse width. Delay circuitry 920 is connected to the receiving circuitry for lengthening the first pulse width by a first amount to form a non-symmetrical reference clock signal 911, the non-symmetrical reference clock having the first period. Master circuitry 940 is connected to the delay circuitry for forming a master clock MASTER having a second period which is twice as long as the first period, consisting of a third pulse having a third pulse width which is approximately equal to the first pulse width of the non-symmetrical reference clock and fourth pulse having a fourth pulse width. Slave circuitry 930 is connected to the delay circuitry for forming a slave clock having a third period which is twice as long as the first period, consisting of a fifth pulse having a fifth pulse width which is approximately equal to the first pulse width of the non-symmetrical reference clock and sixth pulse having a sixth pulse width, the fifth pulse being separated in time from the third pulse by approximately the second pulse width so that the master clock and the slave clock do not overlap.

Delay circuitry 920 is responsive to a change in operating temperature or operating voltage of the integrated circuit to change the first pulse width by a second amount which is proportional to an change in signal propagation time of a logic element within the integrated circuit in response to the change in operating temperature, operating voltage, or processing parameters of the integrated circuit.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. For example, falling edges of reference clock CLK could be delayed with a delay block to form a non-symmetrical reference clock from which signals MASTER and SLAVE are formed. It is therefore contemplated that the appended claims will cover any such modifications of the embodiments as fall within the true scope and spirit of the invention.

What is claimed is:

1. A method for forming non-overlapping clock signals for an integrated circuit, comprising:

providing a reference clock whose frequency is twice that of a desired operating frequency for said integrated circuit, said reference clock having a first period consisting of a first pulse having a first pulse width and a second pulse having a second pulse width;

forming a master clock having a second period which is twice as long as said first period, consisting of a third pulse having a third pulse width which is approximately equal to said first pulse width and fourth pulse having a fourth pulse width;

forming a slave clock having a third period which is twice as long as said first period, consisting of a fifth pulse having a fifth pulse width which is approximately equal to said first pulse width and sixth pulse having a sixth pulse width, said fifth pulse being separated in time from said third pulse by approximately said second pulse width so that said master clock and said slave clock do not overlap; and lengthening said third pulse width by a first amount which is less than said second pulse width.

2. The method of claim 1, further comprising lengthening said fifth pulse width by an amount which is less than said second pulse width.

3. The method of claim 1 further comprising changing said third pulse width by a second amount which is proportional to a change in signal propagation time of a logic element within said integrated circuit in response to a change in operating temperature of said integrated circuit.

4. The method of claim 1 further comprising changing said third pulse width by a second amount which is proportional to a change in signal propagation time of a logic element within said integrated circuit in response to a change in operating voltage of said integrated circuit.

5. The method of claim 1 further comprising changing said third pulse width by a second amount which is proportional to a change in signal propagation time of a logic element within said integrated circuit in response to a change in process parameters of said integrated circuit.

6. A method for forming non-overlapping clock signals for an integrated circuit, comprising:

providing a reference clock whose frequency is twice that of a desired operating frequency for said integrated circuit, said reference clock having a first period consisting of a first pulse having a first pulse width and a second pulse having a second pulse width;

lengthening said first pulse width by a first amount to form a non-symmetrical reference clock signal, said non-symmetrical reference clock having said first period;

forming a master clock having a second period which is twice as long as said first period, consisting of a third pulse having a third pulse width which is approximately equal to said first pulse width of said non-symmetrical reference clock and fourth pulse having a fourth pulse width; and forming a slave clock having a third period which is twice as long as said first period, consisting of a fifth pulse having a fifth pulse width which is approximately equal to said first pulse width of said non-symmetrical reference clock and sixth pulse having a sixth pulse width, said fifth pulse being separated in time from said third pulse by approximately said second pulse width so that said master clock and said slave clock do not overlap.

7. The method of claim 6 further comprising changing said first pulse width by a second amount which is proportional to a change in signal propagation time of a logic element within said integrated circuit in response to a change in operating temperature of said integrated circuit.

8. The method of claim 6 further comprising changing said first pulse width by a second amount which is proportional to a change in signal propagation time of a logic element within said integrated circuit in response to a change in operating voltage of said integrated circuit.

9. An integrated circuit with a clock circuit for forming non-overlapping clock signals for said integrated circuit, comprising:

receiving circuitry within said integrated circuit for receiving a reference clock whose frequency is twice that of a desired operating frequency for said integrated circuit, said reference clock having a first period consisting of a first pulse having a first pulse width and a second pulse having a second pulse width;

master circuitry connected to said receiving circuitry for forming a master clock having a second period which is twice as long as said first period, consisting of a third pulse having a third pulse width which is approximately equal to said first pulse width and fourth pulse having a fourth pulse width;

slave circuitry connected to said receiving circuitry for forming a slave clock having a third period which is twice as long as said first period, consisting of a fifth pulse having a fifth pulse width which is approximately equal to said first pulse width and sixth pulse having a sixth pulse width, said fifth pulse being separated in time from said third pulse by approximately said second pulse width so that said master clock and said slave clock do not overlap; and first delay circuitry connected to said master circuitry for lengthening said third pulse width by a first amount which is less than said second pulse width.

10. The clock circuit of claim 9, further comprising second delay circuitry connected to said slave circuitry for lengthening said fifth pulse width by an amount which is less than said second pulse width.

11. The clock circuit of claim 9 wherein said first delay circuitry is responsive to a change in operating temperature or operating voltage of said integrated circuit to change said third pulse width by a second amount which is proportional to a change in signal propagation time of a logic element within said integrated circuit in response to said change in operating temperature or operating voltage of said integrated circuit.

12. The clock circuit of claim 9, further comprising said first delay circuitry connected to said slave circuitry for lengthening said fifth pulse width by an amount which is less than said second pulse width.

13. An integrated circuit with a clock circuit for forming non-overlapping clock signals for said integrated circuit, comprising:

receiving circuitry within said integrated circuit for receiving a reference clock whose frequency is twice that of a desired operating frequency for said integrated circuit, said reference clock having a first period consisting of a first pulse having a first pulse width and a second pulse having a second pulse width;

delay circuitry connected to said receiving circuitry for lengthening said first pulse width by a first amount to form a non-symmetrical reference clock signal, said non-symmetrical reference clock having said first period; and master circuitry connected to said delay circuitry for forming a master clock having a second period which is twice as long as said first period, consisting of a third pulse having a third pulse width which is approximately equal to said first pulse width of said non-symmetrical reference clock and fourth pulse having a fourth pulse width;

slave circuitry connected to said delay circuitry for forming a slave clock having a third period which is twice as long as said first period, consisting of a fifth pulse having a fifth pulse width which is approximately equal to said first pulse width of said non-symmetrical reference clock and sixth pulse having a sixth pulse width, said fifth pulse being separated in time from said third pulse by approximately said second pulse width so that said master clock and said slave clock do not overlap.

14. The clock circuit of claim 13 wherein said delay circuitry is responsive to a change in operating temperature or operating voltage of said integrated circuit to change said first pulse width by a second amount which is proportional to an change in signal propagation time of a logic element within said integrated circuit in response to said change in operating temperature or operating voltage of said integrated circuit.

15. A method for forming non-overlapping clock signals for an integrated circuit, comprising:

providing a reference clock whose frequency is twice that of a desired operating frequency for said integrated circuit, said reference clock having a first period consisting of a first pulse having a first pulse width and a second pulse having a second pulse width;

forming a master clock having a second period which is twice as long as said first period, consisting of a third pulse delimited by a first edge and a second edge and having a third pulse width which is greater than said first pulse width and a fourth pulse having a fourth pulse width;

forming a slave clock having a third period which is twice as long as said first period, consisting of a fifth pulse delimited by a third edge and a fourth edge and having a fifth pulse width which is greater than said first pulse width and a sixth pulse having a sixth pulse width, said fifth pulse being separated in time from said third pulse so that said master clock and said slave clock do not overlap; and wherein the step of forming a master clock comprises the steps of:
    forming the first edge in response to the reference clock; and
    forming the second edge in response to signal delayed by a first delay amount such that said third pulse width increases in response to an increase in said first delay amount.

16. The method of claim 15, wherein the step of forming a slave clock comprises the steps of:

forming the third edge in response to the reference clock; and forming the fourth edge in response to signal delayed by a second delay amount such that said fifth pulse width increases in response to an increase in said second delay amount.

17. The method of claim 15 wherein the step of forming a master clock further comprises changing said first delay amount by a second amount which is proportional to a change in signal propagation time of a logic element within said integrated circuit in response to a change in operating temperature of said integrated circuit.

18. The method of claim 15 wherein the step of forming a master clock further comprises changing said first delay amount by a second amount which is proportional to a change in signal propagation time of a logic element within said integrated circuit in response to a change in operating voltage of said integrated circuit.

19. The method of claim 15 wherein the step of forming a master clock further comprises changing said first delay amount by a second amount which is proportional to a change in signal propagation time of a logic element within said integrated circuit in response to a change in process parameters of said integrated circuit.

20. An integrated circuit with a clock circuit for forming non-overlapping clock signals for said integrated circuit, comprising:

receiving circuitry within said integrated circuit for receiving a reference clock whose frequency is twice that of a desired operating frequency for said integrated circuit, said reference clock having a first period consisting of a first pulse having a first pulse width and a second pulse having a second pulse width;

delay circuitry operable to provide a first delay amount which is less than said second pulse width;

master circuitry connected to said receiving circuitry and said delay circuitry for forming a master clock having a second period which is twice as long as said first period, consisting of a third pulse having a third pulse width which larger than said first pulse width and a fourth pulse having a fourth pulse width;

slave circuitry connected to said receiving circuitry for forming a slave clock having a third period which is twice as long as said first period, consisting of a fifth pulse having a fifth pulse width which is larger than said first pulse width and sixth pulse having a sixth pulse width, said fifth pulse being separated in time from said third pulse so that said master clock and said slave clock do not overlap; and wherein an increase in the first delay amount results in an increase in the third pulse width.

\* \* \* \* \*